United States Patent [19]

Ishinabe et al.

[11] Patent Number: 5,572,468
[45] Date of Patent: Nov. 5, 1996

[54] STORAGE READING APPARATUS

[75] Inventors: Iwao Ishinabe; Tadashi Saito, both of Koganei; Takashi Kataigi, Hamura; Yoshinobu Igarashi, Niiza; Yukiko Midorikawa, Kodaira, all of Japan

[73] Assignee: Hitachi, Ltd., Tokyo, Japan

[21] Appl. No.: 433,814

[22] Filed: May 3, 1995

[30] Foreign Application Priority Data

| May 19, 1994 | [JP] | Japan | 6-105479 |
| Mar. 13, 1995 | [JP] | Japan | 7-052822 |
| Apr. 19, 1995 | [JP] | Japan | 7-093867 |

[51] Int. Cl.⁶ .................. G11C 7/00; G11C 8/00
[52] U.S. Cl. ............. 365/189.05; 365/196; 365/230.08; 365/233
[58] Field of Search .......... 365/230.05, 230.08, 365/230.01, 230.03, 230.06, 196, 189.05, 233; 327/51

[56] References Cited

U.S. PATENT DOCUMENTS 5,260,904  11/1993  Miyawaki et al. ............... 365/230.08
5,302,867  4/1994   Ahn ............................... 365/196
5,430,688  7/1995   Takasugi ....................... 365/230.08

FOREIGN PATENT DOCUMENTS 56-41575  4/1981  Japan.

*Primary Examiner*—David C. Nelms
*Assistant Examiner*—Trong Phan
*Attorney, Agent, or Firm*—Fay, Sharpe, Beall, Fagan, Minnich, & McKee

[57] ABSTRACT

After a row address and a column address are supplied to a dynamic RAM in response to a row address strobe signal and a column address strobe signal, respectively, a high impedance state is maintained for column address access time period after the fall timing of the column address strobe signal, thereafter data is outputted to a data bus, and the high impedance state of the data bus is quickly resumed after the rise timing of the column address strobe signal. If different column addresses of RAM at the same row address are successively read, data are read and outputted to the data bus in response to a change only in the column address strobe signal, and thereafter, even after the high impedance state of the data bus is quickly resumed, a data value is held by the data bus until the dynamic RAM outputs the data.

19 Claims, 9 Drawing Sheets

STORAGE READING APPARATUS

BACKGROUND OF THE INVENTION

The present invention relates to a technique for reading data from a memory, suitable for applying the technique to a data readout circuit of, for example, a dynamic memory.

In a data readout operation of a general dynamic memory, a memory readout circuit supplies address signals twice in response to two address strobe signals including a row address strobe signal and a column address strobe signal. Specifically, a row address is supplied via an address bus to the memory synchronously with a fall of the row address strobe signal. Next, a column address is supplied synchronously with a fall of the column address strobe. The row address selects memory cells of one row in the word line direction. When the column address is supplied and a corresponding memory cell is selected, data starts being outputted to a data bus. When the column address strobe signal rises, the data output is stopped. The memory is so designed that the data output terminal takes a high impedance state until the next data is outputted after the data output is stopped.

Because of this design, the memory readout circuit is required to fetch data outputted from the memory during the time period from the time a data output is ensured after the column address strobe signal falls to a time when the column address strobe signal rises. In other words, designers have not intended to generate a timing signal for the memory readout circuit to fetch data during the data non-asserted period after a column address strobe signal rises. Namely, in a conventional memory system, data is valid during the period while a column address strobe signal is active, and it is difficult to generate a timing signal for reliably receiving data (refer to FIG. 2 of JP-A-56-41575). If a rise of a column address strobe signal is delayed in order to have a longer data valid time and in order for the data readout circuit to reliably fetch data, a cycle time of the whole system is prolonged so that a high speed operation of a data processor which accesses a dynamic memory has been restricted.

In a conventional system using a dynamic memory, a pullup or pulldown resistor is connected to a data bus interconnecting the dynamic memory and a memory readout circuit in order to prevent the data bus from taking an uncertain level value in the high impedance state. In FIG. 3 of JP-A-56-41575, an example of using a pulldown resistor is shown.

Under the present conditions of increased information amount and advanced semiconductor technology, there is a very high need for reading data from, and writing data to, a large capacity semiconductor memory at high speed. There is a problem associated with shortening a read cycle time of a general dynamic memory. A readout data asserted period is a period from after a lapse of an access delay time after a column address strobe signal falls to a time when the column address strobe signal rises. The problem resides in that in order for the memory readout circuit to reliably fetch data during this period, it becomes necessary to delay a rise timing of a column address strobe signal to some degree. The memory data readout cycle time is a sum of the access delay time, data fetch asserted time, and column address precharge time.

SUMMARY OF THE INVENTION

It is an object of the present invention to provide a data readout circuit capable of shortening a time period from a fall of a column address strobe used for data readout of a dynamic memory to a fall of a next cycle column address strobe signal.

It is another object of the present invention to provide a memory data read/write circuit capable of making a data fetch asserted time period of a memory data read cycle time as short as possible only by adding a simple circuit.

According to the invention, in order to achieve the above objects only by adding as simple a circuit as possible, a memory readout circuit is provided with means for generating a data fetch timing signal for the memory readout circuit to fetch data during a period from when a storage stops outputting the data to when the next data is outputted. A pullup or pulldown resistor is not connected to a data bus although it has been used conventionally, but data is held by capacitance of a data bus and a data output terminal of the storage in a high impedance state. The memory readout circuit fetches data in the form of electric charges held by parasitic capacitance of the data bus.

Data output means may be provided for outputting different data onto the data bus if the data bus maintains a high impedance state for a long period and data is not read successively.

Feedback level holding means may be provided for holding data on the data bus.

Electric charge holding means may be provided for reliably holding data on the data bus.

With the above-described means, a pullup or pulldown resistor is not connected to a data bus although it has been used conventionally, and the data bus takes the high impedance state during the period from when the storage stops outputting data to when the next data is outputted. Therefore, the storage reading means can fetch data in the form of electric charges held by parasitic capacitance of the data bus. The read cycle of the storage can be made as short as possible to an ultimate limit which a read access performance of the storage allows.

By providing the data bus with the data output means, it becomes possible to prevent the data bus from maintaining the high impedance state for a longer time and having an uncertain value.

By providing feedback level holding means, it becomes possible to reliably holding data on the data bus in the high impedance state.

With a provision of the electric charge holding means, electric charges representative of a data value can be stored in the electric charge holding means in the high impedance state of the data bus, so that data on the data bus can be more reliably held.

DESCRIPTION OF THE PREFERRED EMBODIMENTS

Embodiments of the invention will be described with reference to the accompanying drawings.

Figure 1:
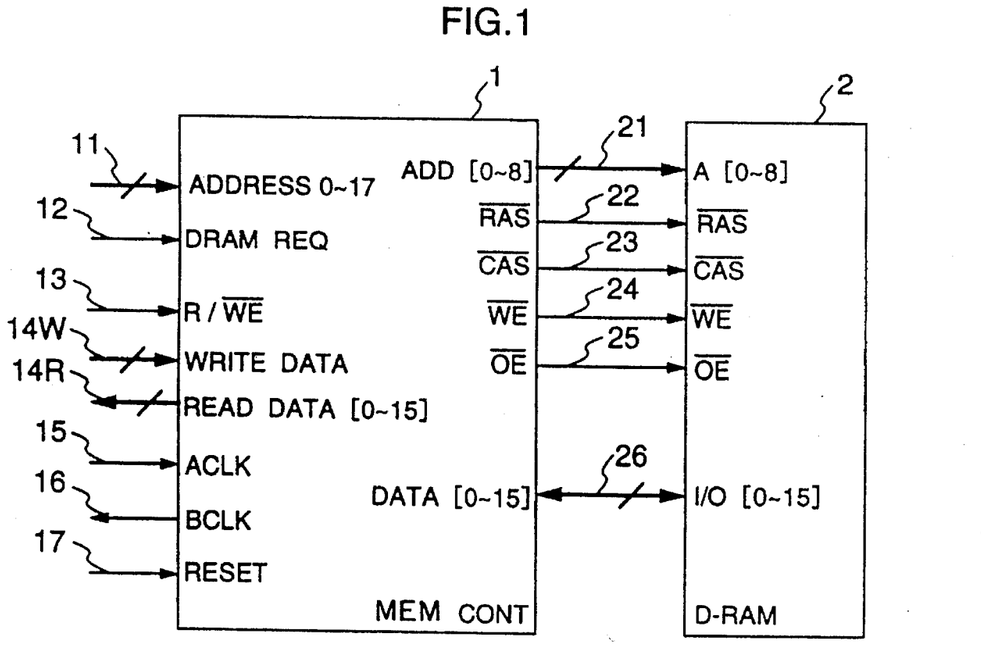
FIG. 1 is a diagram showing a connection state between a memory controller with a built-in memory readout circuit and a dynamic RAM, according to an embodiment of the invention.

FIG. 1 is diagram showing a connection state between a memory controller with a built-in memory readout circuit and a dynamic RAM, according to an embodiment of the invention.

In the accompanying drawings, like functions or signals to those shown in FIG. 1 are represented by using identical reference numerals. Power sources are omitted in the drawings.

In FIG. 1, reference numeral 1 represents a memory controller, and reference numeral 2 represents a dynamic RAM (random access memory). The memory controller 1 receives, for example, a 18-bit address signal, divides it into an upper 9-bit address signal and a lower 9-bit address signal, sequentially supplies them as memory address signals 21 to the dynamic RAM 2. The memory controller 1 receives a dynamic RAM access request signal 12, a read/write discriminating signal 13, and a write data 14W, generates at proper timings a row address strobe signal (RAS) 22, a column address strobe signal (CAS) 23, a write enable signal (WE) 24, and a data output enable signal (OE) 25, and supplies them to the dynamic RAM 2 for the control of data read/write of the dynamic RAM 2. A write data signal and a read data signal for the dynamic RAM 2 is transferred via a 16-bit data bus 26. This data bus 26 is formed on a printed circuit board on which the memory controller 1 and dynamic RAM 2 are mounted.

In FIG. 1, a data signal to be read from the dynamic RAM 2 is indicated by 14R, a master clock to be inputted to the memory controller 1 is indicated by 15, a read control clock to be outputted from the memory controller 1 is indicated by 16, and a reset signal to be inputted to the memory controller 1 is indicated by 17.

Figure 2:
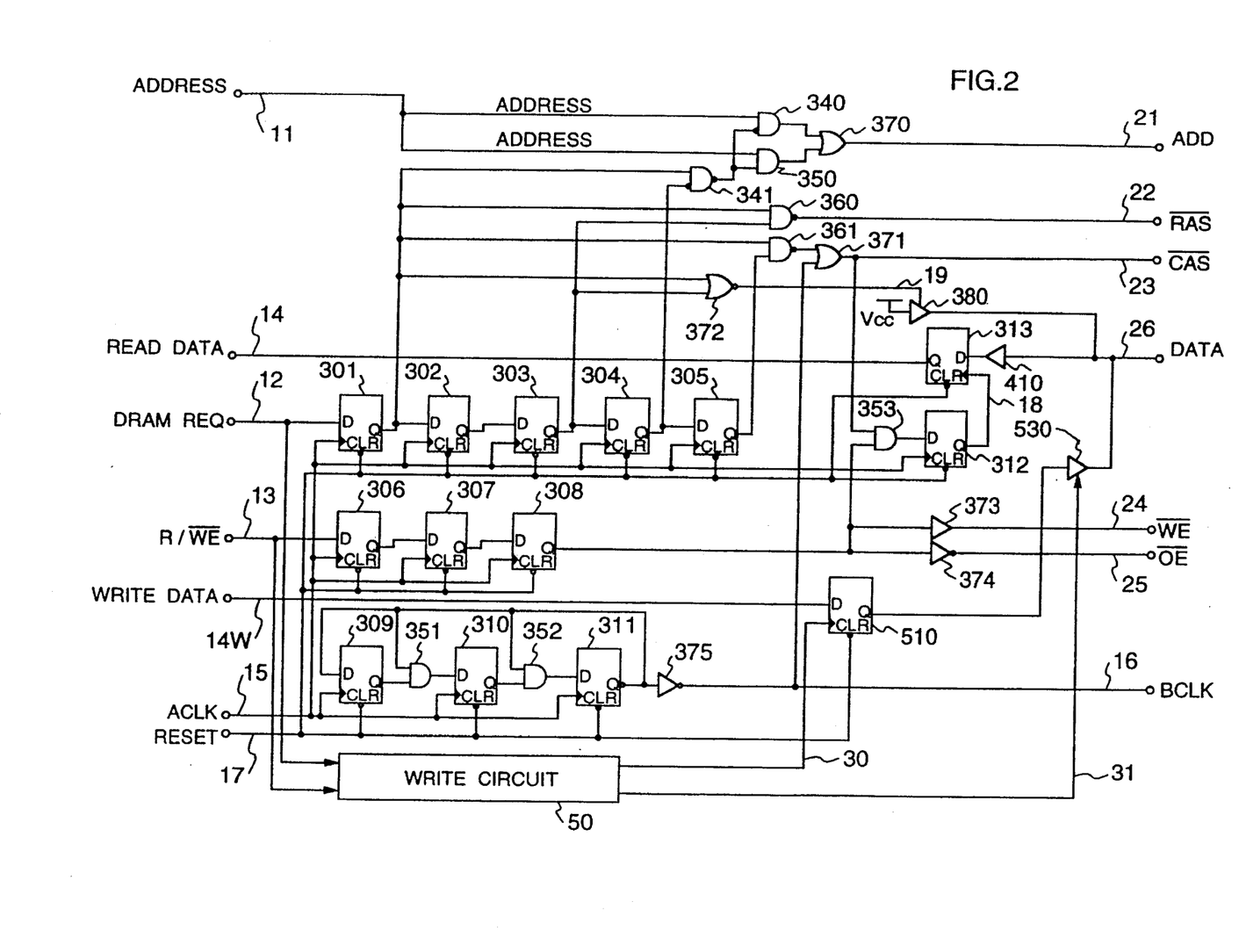
FIG. 2 is a circuit diagram showing an example of the memory controller with a built-in memory readout circuit of the embodiment.

FIG. 2 is a circuit diagram showing a specific example of the structure of the memory controller shown in FIG. 1.

In FIG. 2, reference numerals 301 to 312 represent D-type flip-flops with a clear input terminal for generating timing signals, reference numeral 313 represents a D-type flip-flop for latching readout data signals, reference numeral 340 represents a two-input positive logic output AND gate, reference numeral 341 represents a two-input negative logic output NAND gate with an inverting input terminal, reference numerals 350 to 353 represent two-input positive logic output AND gates, reference numerals 360 to 361 represent two-input negative logic output NAND gates, reference numerals 370 to 371 represent two-input positive logic OR gates, reference numeral 372 represents a two-input negative logic output NOR gate, reference numeral 373 represents a non-inverting output buffer, reference numerals 374 and 375 represent inverting output buffers, reference numeral 380 represents a non-inverting output buffer with a high impedance output control terminal for outputting fixed values in response to an internal control signal 19 outputted from the NOR gate 372, and reference numeral 410 represents a data input buffer. It is to be appreciated that D-type flip-flop 313 and output buffer 380 will actually comprise a plurality of flip-flops and buffers, respectively, in an actual physical embodiment of the invention. Furthermore, it is to be appreciated that flip-flop 410 will actually comprise a plurality of flip-flops in an actual physical embodiment of the invention.

The flip-flops 313 fetches readout data 26 supplied from the data input buffer 410 in response to an internal control signal 18 representative of a readout data fetch timing outputted from the flip-flop 312. In response to an address select signal 20 supplied from the AND gate 341, the AND gates 340 and 350 output an upper 9-bit row address signal or a lower 9-bit column address signal respectively of the 18-bit address signal ill as the memory address signal 21, via the OR gate 370 to the dynamic RAM 2.

Also in FIG. 2, reference numeral 510 represents a D-type flip-flop for latching write data, and reference numeral 530 represents a non-inverting output buffer with a high impedance output control terminal. It is to be appreciated that D-type flip-flop 510 and output buffer 530 will actually comprise a plurality of flip-flops and buffers, respectively, in an actual physical embodiment of the invention. Reference numeral 50 represents a write circuit which it response to the dynamic RAM access request signal 12 and read/write discriminating signal 13, generates internal control signals 30 and 31. The internal control signal 30 supplies timings of fetching the write data 14W to flip-flop 510. The internal control signal 31 supplies data output timings to the output buffer 530.

In this specification, a circuit portion of the whole circuit (memory controller 1) shown in FIG. 2 excepting the flip-flop 510 and output buffer 530 is called a memory readout circuit.

In this embodiment, electric capacitance of the data bus 26 holds electric charges corresponding to readout data. The input buffer 410 of the memory readout circuit detects the voltage level values of electric charges. Electric charge holding means for holding electric charges on the data bus may be connected to the data bus. Such electric charge holding means can be easily realized by connecting a proper capacitor to each signal line of the 16-bit data bus 26.

Figure 3A:
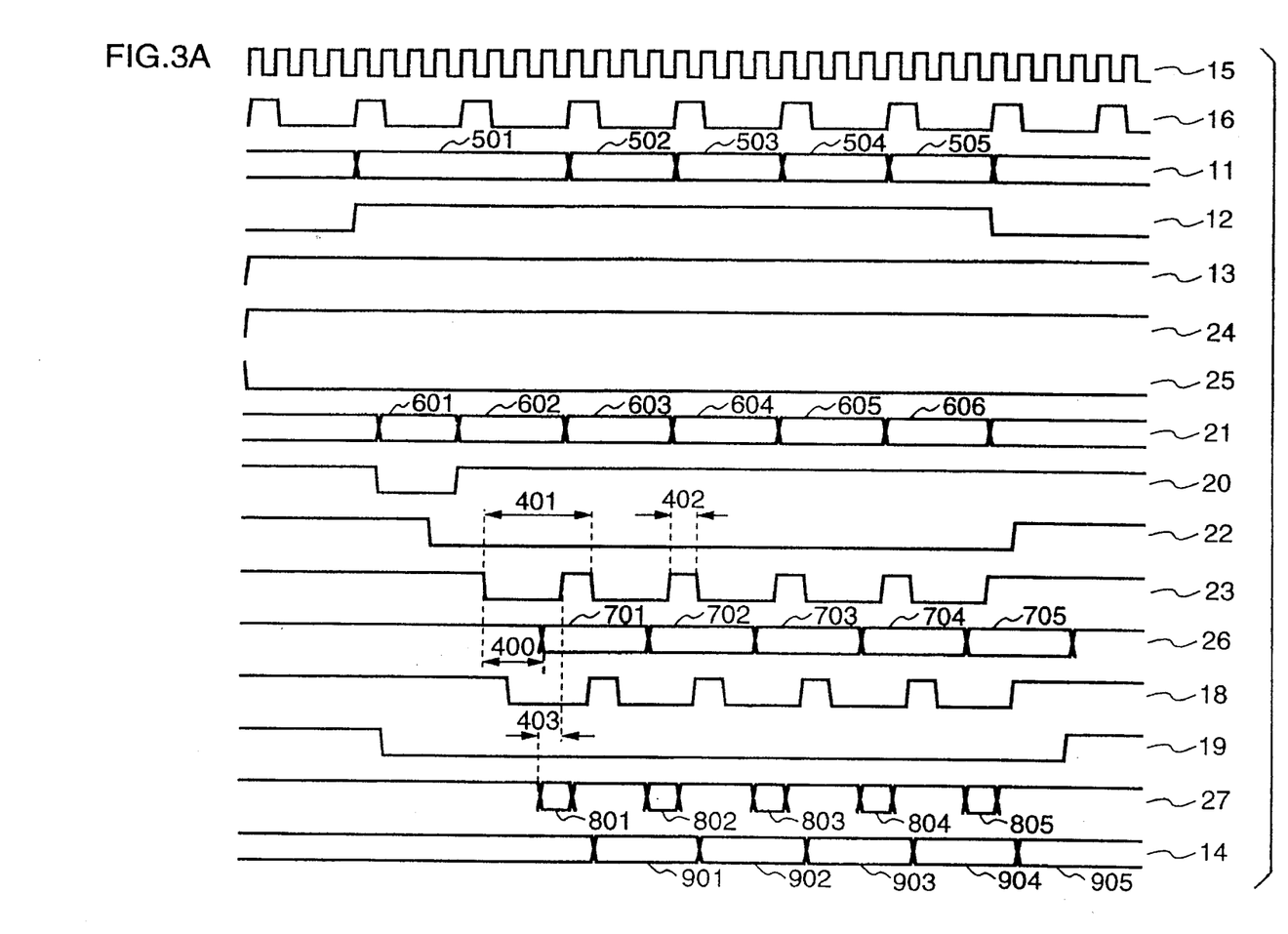
FIG. 3A is a diagram showing typical signal waveforms at various parts of the memory readout circuit of the embodiment.

FIG. 3A shows typical signal waveforms at various parts of the memory readout circuit. In FIG. 3A, reference numeral 400 represents a column address access time of the dynamic RAM 2, reference numeral 401 represents a read cycle time, reference numeral 402 represents a column address precharge time specified by the dynamic RAM 2, signals 11 to 16 and signals 18 to 26 indicate typical signal waveforms of the invention, reference numerals 501 to 505 represent 18-bit read address values, reference numerals 601 to 606 represent 9-bit memory address values, reference numerals 701 to 705 represent 16-bit readout data values outputted to the data bus 26 from RAM 2, and reference numerals 901 to 905 represent readout data output values outputted from the memory readout circuit.

A signal waveform 27 on the data bus 26 is also shown in FIG. 3A which waveform is obtained by connecting a pullup resistor to the data bus 26. Readout data values of this signal waveform are represented by 801 to 805. As will be given in the following description, the data fetch timing signal 18 causes the data 701 to 705 to be fetched at the rise timings thereof. With this signal, the data 801 to 805 can not be fetched if a data fetch time 403 is not prolonged.

In FIGS. 1, 2, and 3A, the memory readout circuit generates the signals 21 to 25 for the readout operation of the dynamic RAM 2 in accordance with the inputted signals 11 to 15, and outputs them to the dynamic RAM 2. The dynamic RAM 2 reads data in the memory cell at the address designated by the address signal 21 and outputs it to the data bus 26.

The dynamic RAM read request signal 12 changes at the rise timing of a read control clock 16 generated from the main clock 15. This request signal 12 has a level "1" when data readout is requested. The request signal is sequentially passed through the D-type flip-flops 301 to 305 of the memory readout circuit. Generated from combinations of outputs from the flip-flops 301 to 305 and the read control clock 16 are the row address strobe signal 22, column address strobe signal 23, fixed value output control signal 19, and address select signal 20.

The 18-bit address signal 11 inputted to the memory readout circuit is divided by the address select signal 20 into an upper 9-bit row address signal and a lower 9-bit column address signal, and outputted as the memory address signal 21. In the example shown in FIG. 3A, consecutive 5-word data is read. Therefore, assuming that the 18-bit address values 501 to 505 are 10000H, 10001H, 10002H, 10003H, and 10004H in hexadecimal notation, the 9-bit memory address values 601 to 606 are 100H, 000H, 001H, 002H, 003H, and 004H.

The 9-bit memory address value 601 is supplied to the dynamic RAM 2 at the fall timing of the row address strobe signal 22, and the 9-bit memory address values 602 to 606 are supplied to the dynamic RAM 2 at the fall timings of the column address strobe signal 23. The read/write discriminating signal 13, write enable signal 24, and data output enable signal 25 take level values "1", "1", and "0" respectively, which indicates a read mode.

When the row address 601 and column address 602 are supplied to the dynamic RAM 2 at the fall timings of the row address strobe signal 22 and column address strobe signal 23, the data output terminal is maintained in a high impedance state until a lapse of the column address access time 400 after the fall timing of the column address strobe signal 23. Thereafter, after the dynamic RAM 2 outputs data read from a memory cell selected by the row address value 601 and column address value 602 to the 16-bit data bus 26, the data output terminal quickly transits to the high impedance state at the rise timing of the column address strobe signal 23.

In the read operation illustrated in FIG. 3A, after the above-described operation, only the column address strobe signal 23 repeats rising and falling to read one or a plurality of memory cells at the same row address value and at different column address values and to sequentially output readout data to the 116-bit data bus 26.

In FIG. 3A, reference numeral 26 represents the waveform of a signal on the data bus according to the embodiment of the invention, and reference numeral 27 represents the waveform of a signal on a conventional data bus with only a pullup resistor connected thereto. The data signal values 701 to 705 read onto the data bus correspond to the data values 801 to 805, each corresponding pair of values having the same data value. With the conventional data bus, after the data output terminal of the RAM 2 transits to the high impedance state, all values on the data bus are fixed to "1" by pullup resistors. In order for the memory readout circuit to read correct data while the dynamic RAM 2 outputs data, a sufficiently long data read time 403 is required. The data read cycle time 401 is equal to the sum of the column address access time 400, data read time 403, and column address precharge time 402, and prolongs as the data read time becomes long.

In contrast with this, in this embodiment, the dynamic RAM 2 outputs data to the data bus 26 and thereafter the data bus 26 transits to the high impedance state at the rise timing of the column address strobe signal. However, because a pullup or pulldown resistor is not connected to the data bus, the data value on the data bus is held until the dynamic RAM 2 outputs data at the next cycle.

Therefore, as shown in FIG. 3A, the data fetch timing signal 18 for fetching data is allowed to rise during the period from a rise of the column address strobe signal 23 to when next data is outputted. The data read time 403 required for a conventional data bus can therefore be made as short as possible. The read cycle time 401 can therefore be shortened and the whole system can be speeded up.

The more detailed description will be given with reference to FIGS. 3B and 3C.

Figure 3B:
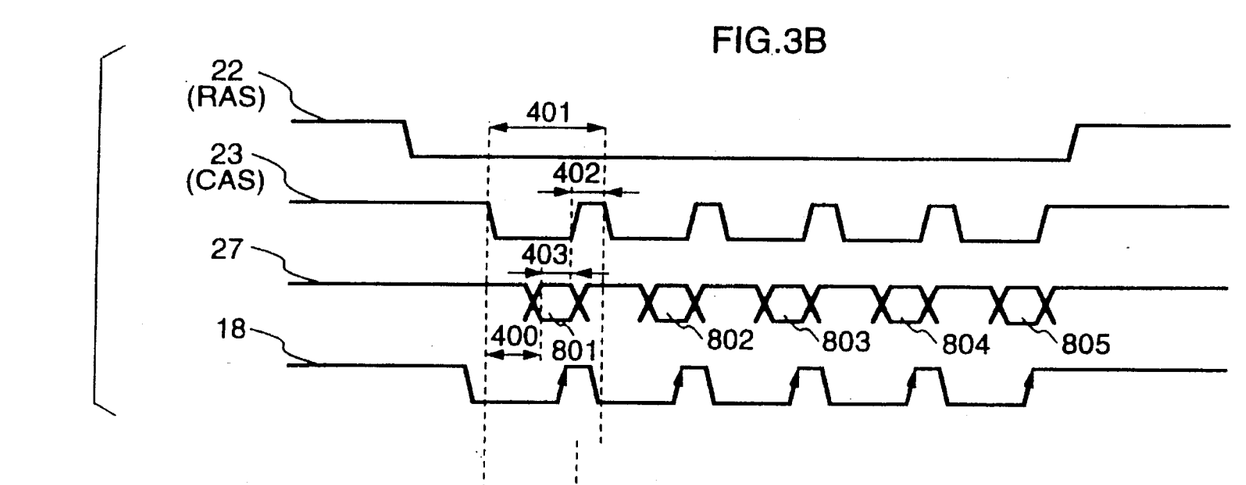
FIG. 3B is a diagram showing typical signal waveforms at various parts of a conventional memory readout circuit.
Figure 3C:
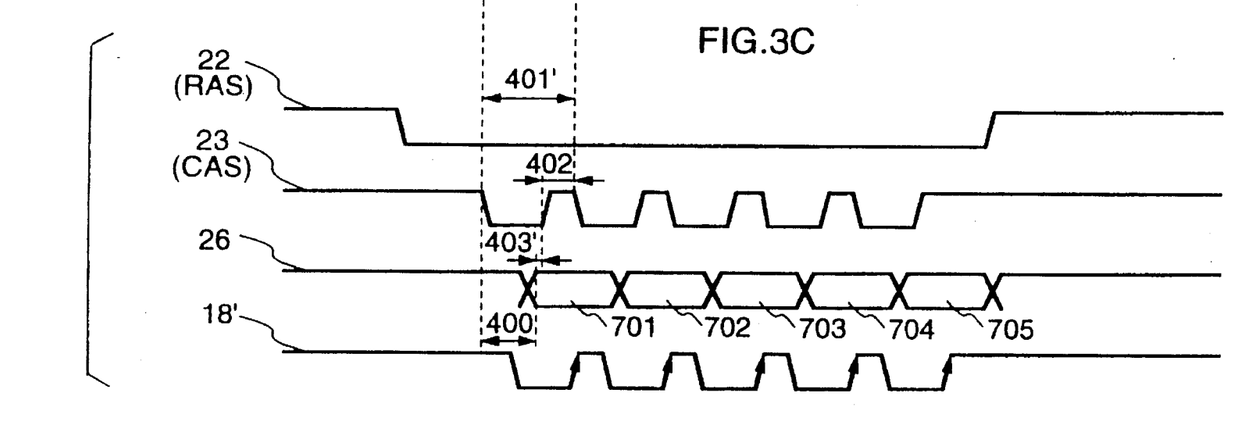
FIG. 3C is a diagram showing typical signal waveforms at various parts of the memory readout circuit embodying the invention.

FIG. 3B shows typical signal waveforms of a conventional memory readout circuit. As seen from FIG. 3B, as a read cycle time becomes short, it becomes difficult to generate the data fetch timing signal 18 for fetching data during a short period from a predetermined time lapse after the column address access time 400 to a rise of the column address strobe signal. As a result, it is necessary to set a sufficiently long time while data is valid in order to reliably fetch the data, by delaying a rise of the column address strobe signal. This becomes an obstacle against speeding up the whole system. FIG. 3C shows typical signal waveforms of the memory readout circuit of the embodiment of this invention. It is sufficient if a data fetch timing signal 18' for fetching data is generated during a period from a lapse of a setup time for the flip-flops and a time required for electrical charge after the column address access time 400 to the next data output. Accordingly, an access time is speeded up and a system applying the present invention can be speeded up.

The fixed value output control signal 19 controls the output buffer 380 to output a fixed value of "1" for all data values on the data bus while data are not read consecutively. In this manner, uncertain values on the data bus are avoided.

The data values 701 to 705 read onto the data bus are fetched by the D-type flip-flop 313 of the memory readout circuit at the rise timings of the data fetch timing signal 18, and outputted as the 16-bit readout data signal 14. The data values 701 to 705 shown in FIG. 3A correspond to the data values 901 and 905, and each pair of corresponding values has the same value.

Figure 4:
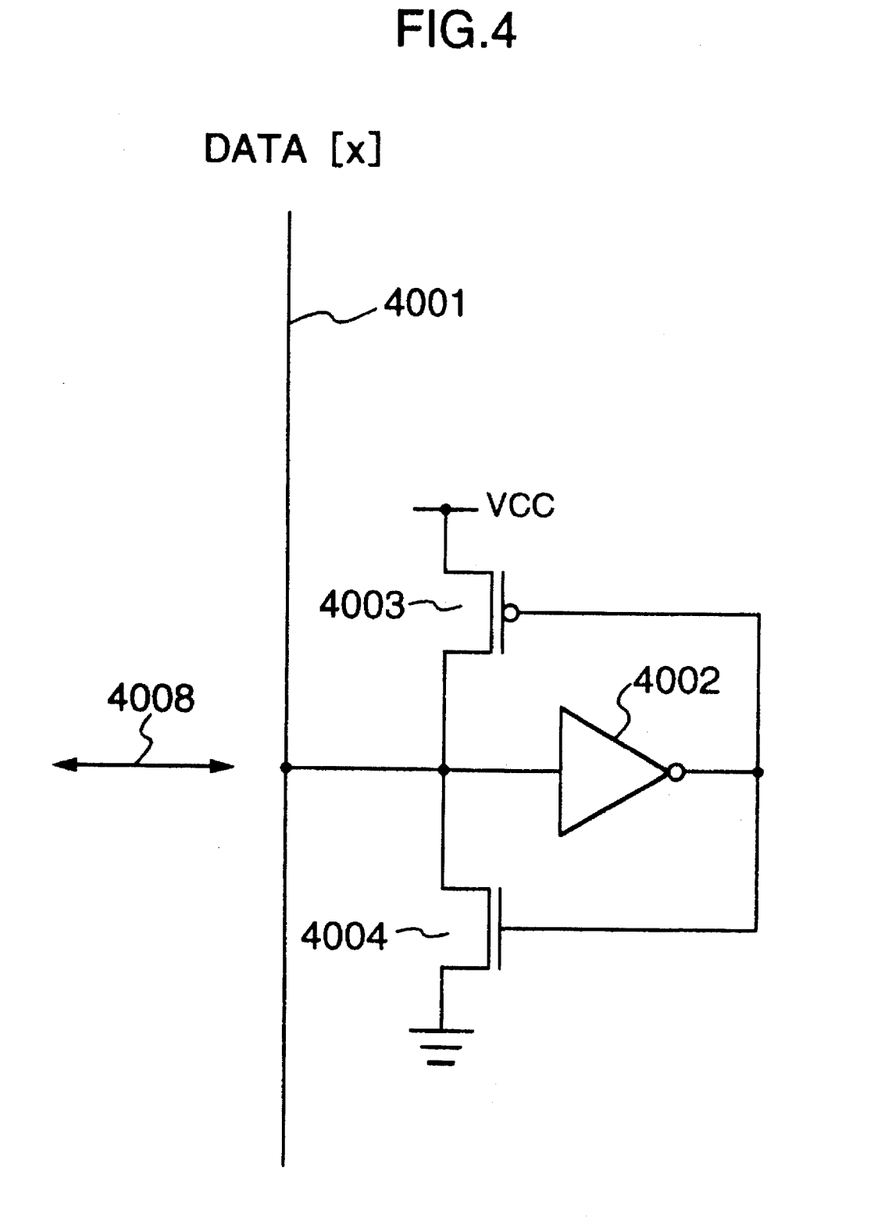
FIG. 4 is a circuit diagram of a feedback level holding circuit according to an embodiment of the invention.

FIG. 4 is a circuit diagram showing an embodiment of a feedback level holding circuit which is used for holding a data value on the data bus 26, instead of using a capacitor connected to each signal line constituting the data bus.

In FIG. 4, reference numeral 4001 represents a signal line constituting the data bus 26, reference numeral 4002 represents an inverter, reference numeral 4003 represents a p-channel field effect transistor, and reference numeral 4004 represents an n-channel field effect transistor. This feedback level holding circuit may be formed as a circuit independent and separate from the memory controller 1 shown in FIG. 1, or may be formed on the same semiconductor substrate as the memory controller 1 shown in FIG. 2.

In FIG. 4, a level value on a data signal line 4001 is inputted to, and inverted by, an inverter 4002, and supplied to the gates of transistors 4003 and 4004. The data signal line 4001 is driven to a Vcc level or a ground level by a combination of transistors 4003 and 4004 in accordance with the level value inputted to the inverter 4002. As the data signal line 4001 is driven by the data output buffer on the dynamic RAM side as indicated by a two-headed arrow 4008 having a drive power greater than that of the combination of the transistors 4003 and 4004, the level value of the data signal line 4001 changes and the combination of transistors 4003 and 4004 establishes the level of the data signal line 4001 in accordance with an output signal of the inverter 4002, i.e., in accordance with the fast changed level value on the data signal line 4001.

The data signal line 4001 is therefore caused to hold the same level value by the combination of transistors 4003 and 4004 until the data signal line 4001 is driven to the opposite level by the output buffer on the RAM side. The transistors 4003 and 4004 are designed to have device parameters which set a drive power of the combination of transistors 4003 and 4004 smaller than that of the data output buffer on the RAM side. A drive power depends on an on-resistance of each transistor. A combination of transistors with a larger on-resistance provides a smaller drive power so that the transistors are easily inverted by the memory output buffer.

Figure 5:
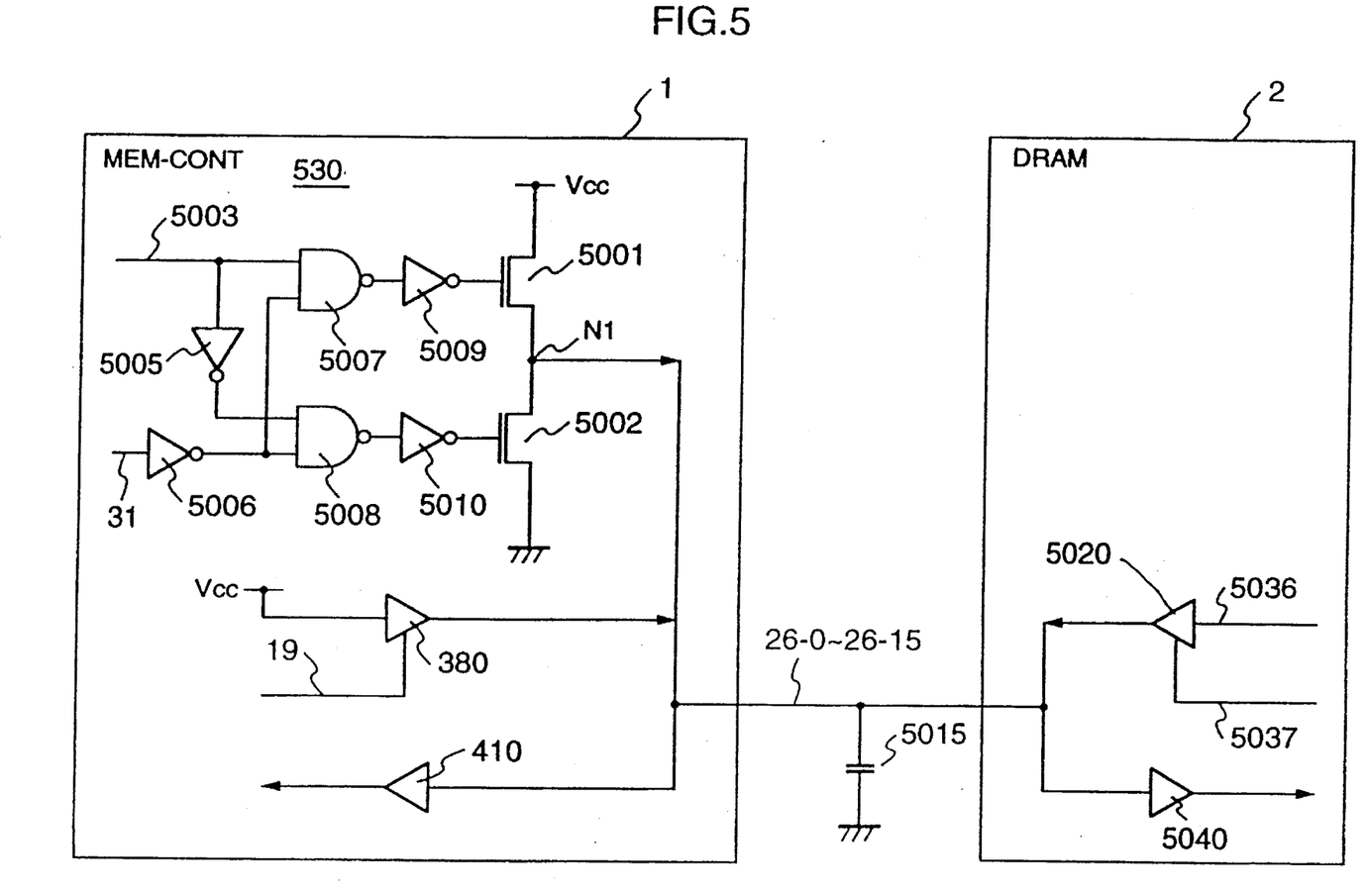
FIG. 5 is a particular circuit diagram showing a specific example of the structure of output buffers 530 to 545.

FIG. 5 shows the structure of a data input/output section of the memory controller 1 and dynamic RAM 2 and a specific example of the circuit structure of the output buffer 530.

The output buffer 530 of this embodiment are constituted by a push-pull type output stage and an output control section. The output stage is made of a pair of n-channel field effect transistors 5001 and 5002 serially connected between a power source voltage terminal Vcc and a ground terminal. The output control section generates a signal for driving the transistors 5001 and 5002 in accordance with an output data signal 5003 and an output control signal 31.

The output control section is constituted by an inverter 5005 for inverting the output data signal 5003, another inverter 5006 for inverting the output control signal 31, a two-input NAND gate 5007 for receiving the output data signal 50 and an output signal of the inverter 5006, another two-input NAND gate 5008 for receiving inverted signals from the inverters 5005 and 5006, and inverters 5009 and 5010 for inverting output signals of the NAND gates 5007 and 5008 and supplying them to the gates of the transistors 5001 and 5002.

When the output control signal 31 takes the high level, both the transistors 5001 and 5002 are turned off and the output node N1 enters a high impedance state. In this state, the levels on signal line 260 constituting the data bus 26 are held relative to a ground potential by capacitors between the signal lines and the connection terminals. It is to be appreciated that line 26 will actually comprise a plurality of lines in an actual physical embodiment of the invention.

The fixed value output buffers 380 to 395 connected to the data bus 26 has a similar structure to the output buffer 530. The fixed value output buffer 380 is supplied with a fixed level (e.g., Vcc) instead of the output data signal 5003, and with the internal control signal 19 shown in FIG. 2 as the output control signal. The high impedance means an impedance of a few scores kΩ, for example, about 40 kΩ or higher relative to a power source level or ground level. Such a conventional pullup or pulldown resistor may be removed and a resistor of about 40 kΩ may be used instead.

Output buffer 5020 on the dynamic RAM 2 side has the same structure as the output buffer 530 of the memory controller 1. It is to be appreciated that buffer 5020 will actually comprise a plurality of buffers in an actual physical embodiment of the invention. Reference numeral 36 represents a data signal read from a memory array (not shown), reference numeral 5037 represents an output control signal, and reference numeral 5040 represents an input buffer for receiving write data signals outputted from the output buffer 530 to the signal 26 of the data bus 26. It is to be appreciated that buffer 5040 will actually comprise a plurality of buffers in an actual physical embodiment of the invention.

Table 1 shows a relationship between the input signals 22 (RAS), 23 (CAS), 24 (WE), 25 (OE), output states, and operation modes, respectively used by this embodiment. "OUTPUT CONTROL" in Table 1 corresponds to the output control signal 5037 shown in FIG. 5.

TABLE 1

| INPUT SIGNAL | | | | OUTPUT CONTROL | OUTPUT SIGNAL | |
|---|---|---|---|---|---|---|
| RAS | CAS | WE | OE | OUTCNT | I/O | OPERATION |
| H | H | H | H | H | High-Z | STAND-BY |
| L | H | H | H | H | High-Z | REFRESH |
| L | L | H | L | L | Dout | READ |
| L | L | L | H | L | Din | WRITE |
| L | L | H | H | H | High-Z | |
| L | H | H | L | H | High-Z | |

Figure 6:
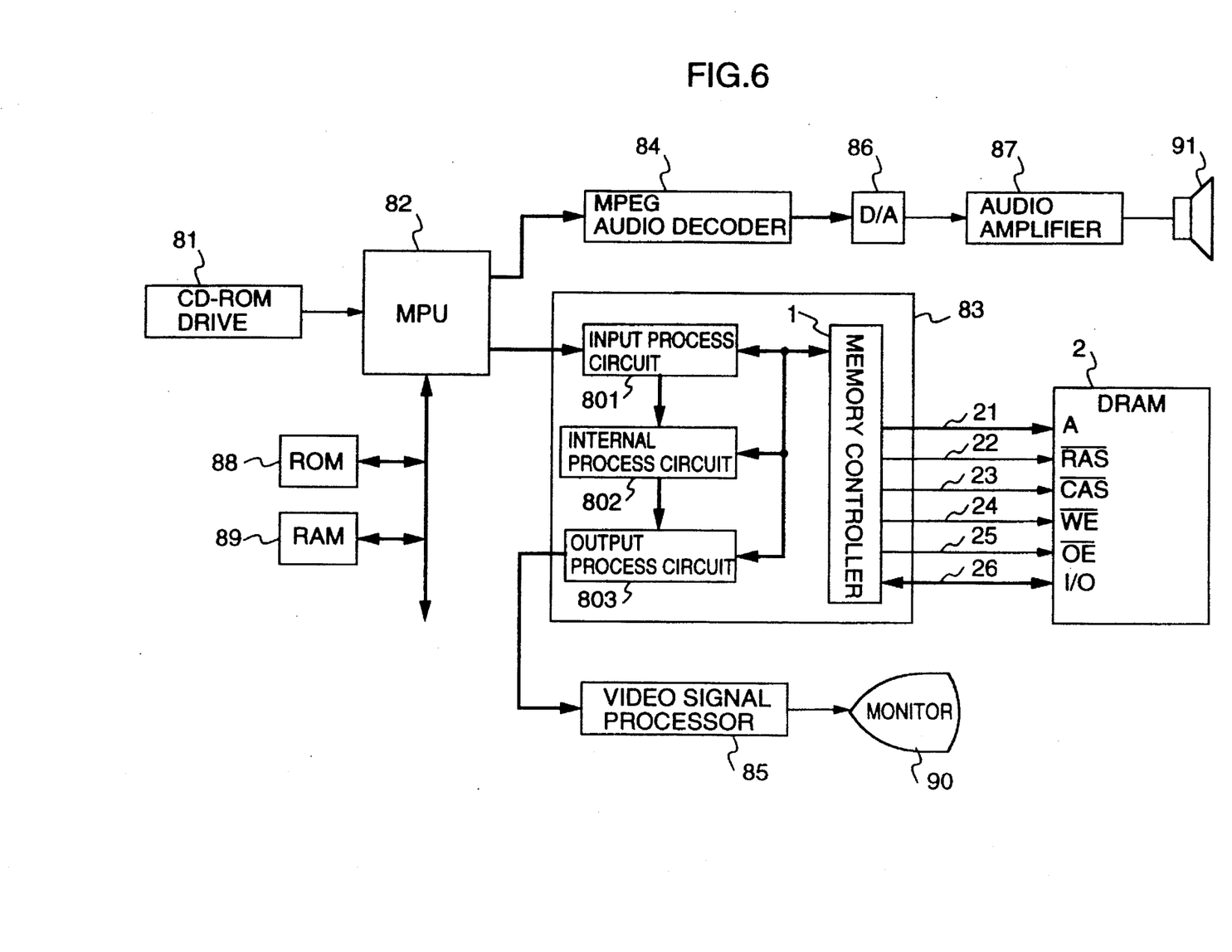
FIG. 6 is a block diagram showing an embodiment wherein the memory controller is used for an MPEG video decoder LSI.

FIG. 6 is a block diagram showing another embodiment wherein the memory controller of the embodiment described above is applied to an MPEG (Moving Picture Expert Group) video decoder (moving image decoder) LSI forming a moving image reproduction system in conformity with the video standards called MPEG.

The moving image reproduction system of this embodiment is constituted, as shown in FIG. 6, by a CD-ROM drive 81, a microprocessor 82, an MPEG audio decoder 84, an MPEG video decoder 83, a video signal processor 85, a D/A converter 86, an audio amplifier 87, and other elements. The CD-ROM drive 81 reads moving image data compressed, encoded, and stored in a CD-ROM. The microprocessor 82 separates the readout data (hereinafter called a bit stream) into image data and audio data and analyzes control information. The MPEG audio decoder 84 decodes the separated audio data, and the MPEG video decoder 83 decodes the separated moving image data. The video signal processor 85 converts the decoded image data (digital signal) into an analog signal and into R, G, and B signals by image synthesizing or the like, and supplies them to a monitor 90. The D/A converter 86 converts audio data decoded by the MPEG audio decoder 84 into an analog signal. The audio amplifier 87 amplifies the converted audio signal and drives a speaker 91.

Reference numeral 88 represents a read-only memory for storing programs to be executed by the microcomputer 82 and fixed data. Reference numeral 89 represents a random access memory used for working areas of the microprocessor 82. In this system, a hard disk drive may be used in place of the CD-ROM drive.

The MPEG video decoder 83 is provided with an input process circuit 801, an internal process circuit 802, and an output process circuit 803 as well as the memory controller 1 of the embodiment described with FIG. 2. The input process circuit 801, internal process circuit 802, or output process circuit 803 supplies the memory access request signal 12 to the memory controller 1 which in turn performs a read/write operation of the dynamic RAM 2.

The MPEG video decoder 83 of this embodiment is formed as a semiconductor integrated circuit fabricated on a single semiconductor substrate such as silicon, although the invention is not limited only thereto. In this system, the dynamic RAM 2 connected to the MPEG video decoder 83 is used as buffer areas (frame memory) for temporarily storing image data before and after decoding.

A bit stream read by the microprocessor 82 is inputted to the MPEG video decoder 83 at a constant speed, for example, at 1.2 Mbps. There are three MPEG video encoding schemes including an intra-coded picture scheme (I-picture), predictive-coded picture scheme (P-picture), and a bidirectionally predictive-coded picture scheme (B-picture). The data amount of a video bit stream per one frame necessary for the reproduction of an image frame differs greatly between the three encoding schemes. In encoding, a transmission rate of a video bit stream is controlled to be generally constant, by combining the three encoding schemes. A frame transfer rate commonly used in Japan and U.S.A. is about 30 Hz, and that used in Europe and other countries is 25 Hz, respectively constant. Therefore, a transfer rate of a video bit stream necessary for decoding an image frame subjected to the three encoding schemes differs greatly. Although the transfer rate depends on a frame to be processed, it is about 7 Mbps, 2 Mbps, and 0.6 Mbps, respectively.

In order to compensate for a difference between a transmission rate of an inputted video bit stream and a transfer rate of a video bit stream used for decoding, the input process circuit 801 performs a process of using part of the dynamic RAM 2 as a first-in first-out buffer area. Specifically, an inputted video bit stream is sequentially written in the buffer area of the dynamic RAM 2 supervised by the input process circuit 801 while updating the write address.

When the internal process circuit 802 requests a video bit stream for decoding, the input process circuit 801 generates and updates the read address at a speed satisfying the necessary transfer rate, sequentially reads a video bit stream from the dynamic RAM 2, and supplies it to the internal process circuit 802. In this case, the input process circuit 801 supervises the write and read addresses so as not to overflow or underflow the first-in first-out buffer area partially formed in the dynamic RAM 2.

In the internal process circuit 802, an input bit stream is subjected to variable length code decoding, reverse quantization, and frequency conversion so as to decode a frame matching the encoding scheme. In the case of a frame encoded by the intra-coded picture scheme, reproduced data is stored as a reference frame in the buffer area partially formed in the dynamic RAM 2. In the case of a frame encoded by the predictive-coded picture scheme, reproduced data and partial data of a reference frame are read from the dynamic RAM 2 and added together if necessary, and stored as a reference frame in the buffer area of the dynamic RAM 2.

In the case of a frame encoded by a bidirectionally predictive-coded picture scheme, reproduced data and partial data of two reference frames are read from the dynamic RAM 2 and added together if necessary, and stored as a reference frame in the buffer area for frame reproduction. In decoding a frame encoded by a bidirectional inter-frame prediction encoding scheme, it is necessary for the dynamic RAM 2 to reserve a buffer area of two frames at a minimum and one frame at a minimum for holding a reproduced frame until the output process circuit 803 completes its read operation.

The output process circuit 803 reads a plurality of frame data stored in the buffer area in the same order as the encoded frames, and outputs them together with timing signals for forming a video signal.

Figure 7:
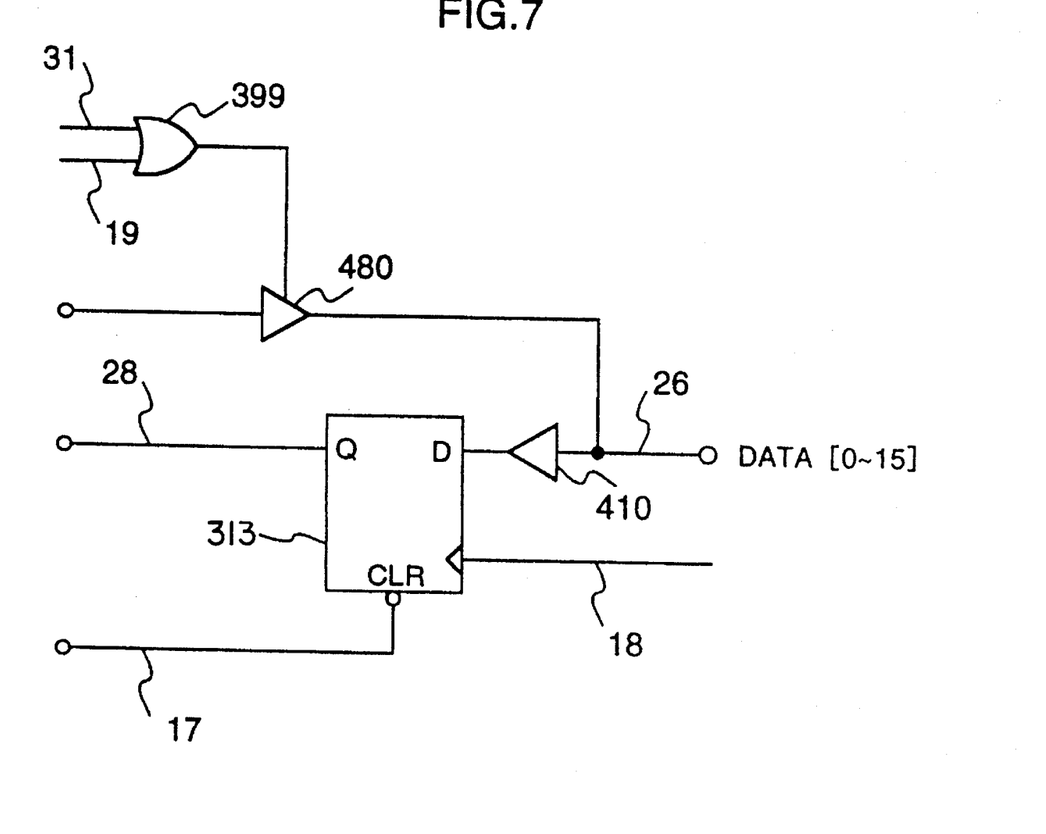
FIG. 7 is a circuit diagram showing the main part of a memory readout circuit according to another embodiment of the invention.

FIG. 7 shows the main part of a memory readout circuit according to another embodiment of the invention. In this embodiment, if data is not consecutively read, the previous write data latched by the flip-flop 510 is outputted onto the data bus 26 by using the write data output buffer 530, in order to avoid uncertain levels on the signal lines of the data bus 26.

A different point of this embodiment from that shown in FIG. 2 is that instead of using the fixed value output buffer 380 shown in FIG. 2, a two-input OR gate 399 is used. Inputted to one input terminal of the OR gate 399 is the fixed value output internal control signal 19 outputted from the NOR gate 372, and inputted to the other input terminal thereof is the write control signal outputted from the write circuit 50. In this embodiment, only a single two-input OR gate 399 is used in common for the buffer 380, instead of using sixteen buffers 380 to 395 corresponding in number to that of signal lines of the data bus 26.

Figure 8:
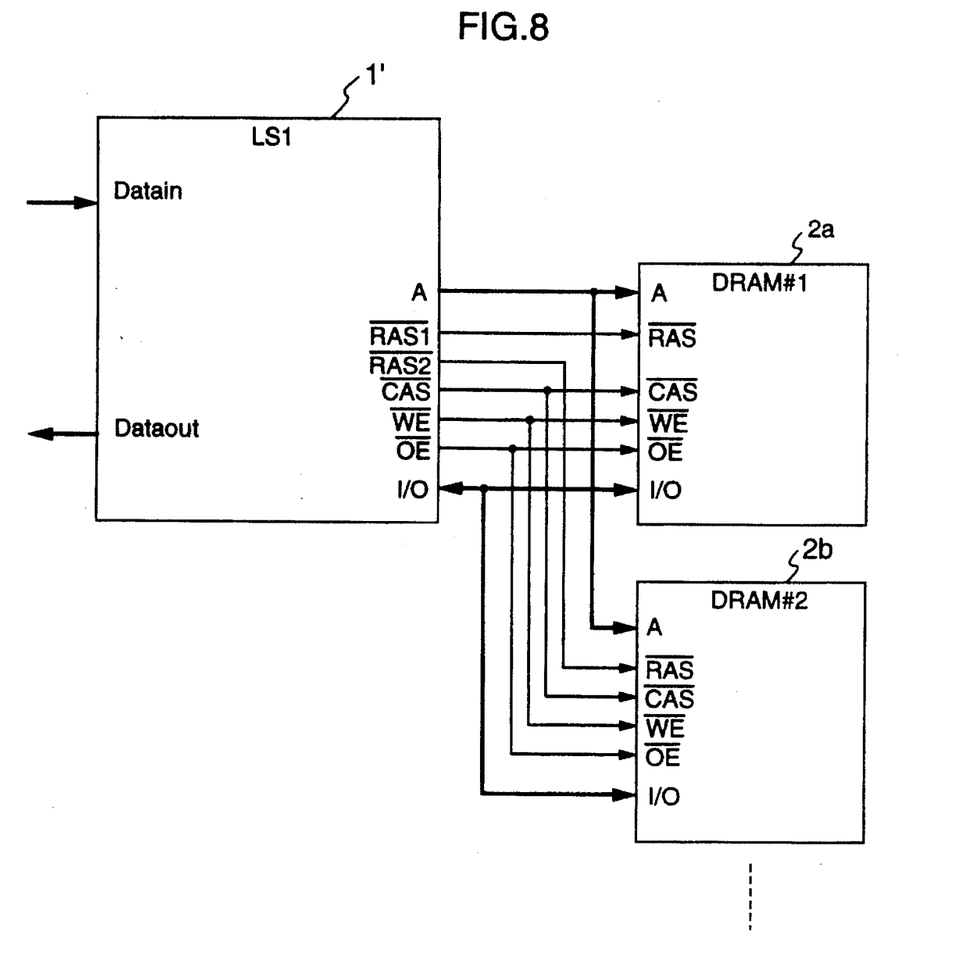
FIG. 8 is a diagram showing a memory readout circuit according to still another embodiment of the invention.
Figure 9:
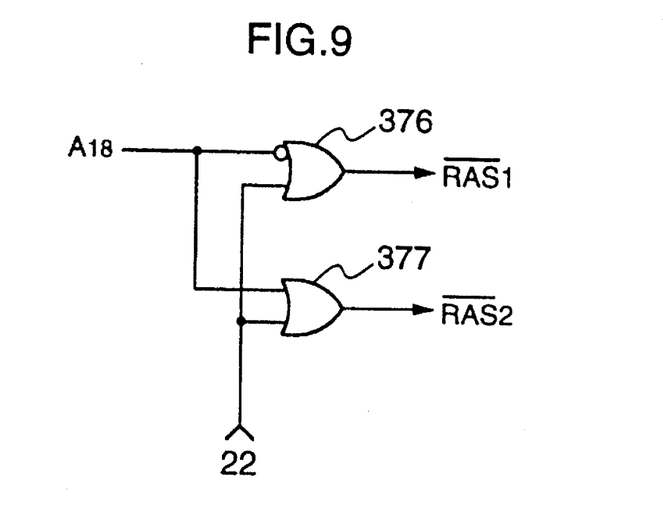
FIG. 9 is a circuit diagram showing a circuit for generating column address strobe signals RAS1 and RAS2.

FIG. 8 shows a memory readout circuit according to still another embodiment of this invention. In this embodiment, a memory controller 1' is adapted to generate a first row address strobe signal RAS1 and a second row address strobe signal RAS2. As a result, two dynamic RAMs 2a and 2b can be connected to the single memory controller 1'. A specific example of a circuit for generating such row address strobe signals RAS1 and RAS2 is shown in FIG. 9.

Assuming that the capacity of each of the dynamic RAMs 2a and 2b is the same as that of the dynamic RAM 2 shown in FIG. 1, an address signal 11 of 19 bits one bit larger than the embodiment shown in FIG. 1 is inputted to the memory controller 1'. Two two-input OR gates 376 and 377 are added to the circuit shown in FIG. 2, the OR gates receiving at one input terminals the true and false levels of the most significant bit A18 of the address signal 11 as their active levels. Inputted to the other input terminals thereof is the output signal 22 of the NAND gate 360 for forming the RAS signal shown in FIG. 2. In this manner, the row address strobe signals RAS1 and RAS2 taking one of the true and false levels as their active level can be formed by the OR gates 376 and 377. In a similar manner, one memory controller may control three or more (preferably a multiple of 2) dynamic RAMs.

As described so far, in the above embodiments, means is provided for generating a data fetch timing signal for a memory readout circuit to fetch data during a period from when a dynamic RAM stops outputting the data to when the next data is outputted. A pullup or pulldown resistor is not connected to a data bus although it has been used conventionally, but data is held by capacitance of a data bus and a data output terminal of the dynamic RAM in a high impedance state. Therefore, the memory readout circuit can fetch data in the form of electric charges held by parasitic capacitance of the data bus. The read cycle of the dynamic RAM can be made as short as possible to an ultimate limit which a read access performance of the dynamic RAM allows.

Data output means is provided for outputting data held by a flip-flop if the high impedance state of the data bus continues longer than a predetermined time period during a data read operation, the flip-flop being used as fixed data or write data holding means. It is therefore possible to prevent uncertain level values to be caused by the high impedance state of the data bus during a long time period. As a result, it is possible to prevent fetching erroneous data and system malfunction.

Feedback level holding means is provided so that data on the data bus in the high impedance state can be reliably held.

With a provision of electric charge holding means, electric charges representative of a data value can be stored in electric charge holding means in the high impedance state of the data bus, so that data on the data bus can be more reliably held.

The invention made by the inventor has been described particularly in connection with the preferred embodiments. The invention is not intended to be limited to the above embodiments, but it is apparent that various modifications are possible without departing from the scope of the invention.

In the above description, the invention made by the inventor has been applied mainly to a buffer memory of an MPEG system which has been used as one application field of the background of this invention.

The invention is not limited to this, but is applicable to a general controller of a dynamic RAM. According to the present invention, a data read cycle of a dynamic memory can be speeded up only by adding a simple circuit.

What is claimed is:

1. A storage accessing circuit for accessing data in a storage means, said storage accessing circuit comprising:

means, connected to said storage means, for outputting an address signal to said storage means;

means for supplying a strobe signal indicating a signal timing for said address signal;

means for inputting data from said storage means, said data being valid during an assert period, while said strobe signal is outputted, and also during a non-assert period, while said strobe signal is not outputted, said data further being valid until subsequent data is outputted;

a data bus connected between said means for inputting data and said storage means;

a data write circuit connected to said data bus for outputting data via said data bus to said storage means;

a buffer means for separating said data write circuit from said data bus;

means for outputting predetermined data onto said data bus, during a period while said data write circuit is separated from said data bus, via said buffer means, said means for outputting predetermined data being connected to said data bus; and a data input timing means for generating a data input timing signal, in accordance with said strobe signal, for inputting data from said storage means during said assert period and said non-assert period until the subsequent data is output from said storage means.

2. The storage accessing circuit according to claim 1, wherein:

timings of said address signal and said strobe signal are switched in accordance with a clock signal; and said data input timing means includes a means for inputting a level of said strobe signal at a timing of a change in said clock signal.

3. The storage accessing circuit according to claim 2, further comprising a level holding circuit connected to said data bus for holding a level, said level holding circuit having:

p-channel and n-channel field effect transistors serially connected at drains thereof; and an inverter, with an input connected to an interconnection of said drains of said field effect transistors, and an output connected to gates of both said field effect transistors.

4. The storage accessing circuit according to claim 3, wherein said serially connected field effect transistors invert a held level by a drive power greater than a drive power determined by on-resistance of said field effect transistors.

5. The storage accessing circuit according to claim 2 further comprising a capacitor connected to said data bus.

6. The storage accessing circuit according to claim 1, wherein said data inputting means has a data bus for connection to said storage means, and a level holding circuit connected to said data bus for holding a level, said level holding circuit having p-channel and n-channel field effect transistors serially connected and an inverter connected between an interconnection of said field effect transistors and both gates of said field effect transistors.

7. The storage accessing circuit according to claim 6, wherein said serially connected field effect transistors invert a held level when a drive power becomes greater than a second drive power determined by on-resistance of said field effect transistors.

8. The storage accessing circuit according to claim 1, further comprising a capacitor connected to said data bus.

9. The storage accessing circuit according to claim 2, further comprising:

a data bus stabilizing circuit connected to said data write circuit for sending data of said data write circuit onto said data bus in response to a control signal for controlling said data write circuit, said data being sent during a period while said buffer means causes said data bus to enter a high impedance state.

10. An accessing circuit for a storage comprising:

a storage reading means including means for outputting an address, means for outputting an address strobe signal indicating a timing for inputting said address to a storage means, and means for inputting data outputted onto a data bus connected between said means for inputting data and said storage means, said data on said data bus not being made invalid by said address strobe signal and said data further being valid until subsequent data is outputted, said storage means being connected to said storage reading means, receiving said address at one of a fall time and a rise time of said inputted address strobe signal, being connected to said data bus in a high impedance state until at least one bit is selected from a plurality of storage information sets stored therein in accordance with said received address, outputting said selected storage information sets to said data bus, and stopping outputting of said selected storage information sets and being connected to said data bus in the high impedance state after one of said rise time and said fall time of said address strobe signal;

a data write circuit connected to said data bus for outputting data via said data bus to said storage means;

a buffer means for separating said data write circuit from said data bus;

means for outputting predetermined data onto said data bus, during a period while said data write circuit is separated from said data bus, via said buffer means, said means for outputting predetermined data being connected to said data bus; and means for supplying a data input timing for said storage reading means during a period from when said storage means outputs data until said subsequent data is output from said storage means.

11. The accessing circuit for a storage according to claim 10, further comprising data output means connected to said storage reading means and to said data bus, said data output means being switchable between a data output state and the high impedance state for taking the data output state if said data bus enters the high impedance state for a long period, wherein during a successive data read from said storage means, data on said data bus is fetched by said storage reading means before subsequent data is outputted after said storage means outputs successive data onto said data bus and stops outputting, and under the condition that a subsequent read does not exist, said data bus is maintained in the high impedance state and thereafter said data output means outputs predetermined data onto said data bus.

12. The accessing circuit for a storage according to claim 10, further comprising feedback level holding means connected to a data input terminal for driving said data bus by an inputted level and driving said data bus in accordance with a level changed by a drive power greater than a drive power of said feedback level holding means.

13. The accessing circuit for a storage according to claim 10, further comprising electric charge holding means connected to a data input terminal.

14. A readout circuit for a storage means comprising:

means for outputting an address signal comprising a plurality of bits;

means for outputting a strobe signal indicating a timing for inputting said address signal to said storage means;

means for fetching a data signal on a data bus, said data on said data bus not being made invalid by said strobe signal and said data further being valid until subsequent data is outputted from said storage means;

said storage means receiving said address signal at one of a fall and a rise of said strobe signal, said data output terminal taking a high impedance state until data is selected, from a plurality of storage information sets stored therein, in accordance with said received address signal and until said data is read out, and stopping the read out of said data after one of a rise and a fall of said strobe signal which causes the output terminal to again take the high impedance state;

said data bus being connected between said means for inputting data and said storage means;

a data write circuit connected to said data bus for outputting data via said data bus to said storage means;

a buffer means for separating said data write circuit from said data bus;

means for outputting predetermined data onto said data bus, during a period while said data write circuit is separated from said data bus, via said buffer means, said means for outputting predetermined data being connected to said data bus; and signal generating means for generating and supplying a data fetch timing signal to said data fetching means during a period when said storage means starts outputting data and until said subsequent data is output from said storage means.

15. The readout circuit for a storage means according to claim 14, further comprising fixed data output means for outputting predetermined fixed data if said data bus takes the high impedance state longer than a predetermined period during a data readout operation.

16. The readout circuit for a storage means according to claim 14, further comprising data holding means for holding write data for said storage means and data output means for outputting the write data held in said data holding means, wherein the write data held in said data holding means is outputted if said data bus takes the high impedance state longer than a predetermined period during a data readout operation.

17. A storage system comprising:

storage means for receiving an address signal at one of a fall and a rise of an address strobe signal, causing a data output terminal to take a high impedance state until data is selected from a plurality of storage information sets stored in said storage means, in accordance with said received address signal, and until said data is read out, and stopping the read out of said data after one of a rise and a fall of said strobe signal which causes the output terminal to again take the high impedance state;

said data bus being connected between said means for inputting data and said storage means;

a data write circuit connected to said data bus for outputting data via said data bus to said storage means;

a buffer means for separating said data write circuit from said data bus;

means for outputting predetermined data onto said data bus, during a period while said data write circuit is separated from said data bus, via said buffer means, said means for outputting predetermined data being connected to said data bus; and a readout circuit connected to said storage means via a data bus, said readout circuit including means for outputting the address signal of a plurality of bits to said storage means, means for outputting the strobe signal indicating an input timing of the address signal to said storage means, a data fetching means for fetching data on said data bus, and signal generating means for generating and supplying a data fetch timing signal to said data fetching means during a period when said storage means starts outputting data to when next data is outputted.

18. The storage system according to claim 17, further comprising electric charge holding means connected to each signal line constituting said data bus.

19. The storage system according to claim 17, further comprising feedback level holding means connected to each signal line constituting said data bus, said feedback level holding means including level detecting means of detecting a level of said signal line and driving means for driving said signal line in accordance with a level detected by said level detecting means.

* * * * *